(12) United States Patent
Pyo et al.

(10) Patent No.: US 7,755,966 B2
(45) Date of Patent: Jul. 13, 2010

(54) MEMORY DEVICE PERFORMING A PARTIAL REFRESH OPERATION BASED ON ACCESSED AND/OR REFRESHED MEMORY BLOCKS AND METHOD THEREOF

(75) Inventors: Suk-Soo Pyo, Yongin-si (KR); Hyun-Taek Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 275 days.

(21) Appl. No.: 11/975,021

(22) Filed: Oct. 17, 2007

(65) Prior Publication Data

US 2008/0094931 A1 Apr. 24, 2008

(30) Foreign Application Priority Data

Oct. 18, 2006 (KR) .................. 10-2006-0101454

(51) Int. Cl.
*G11C 7/00* (2006.01)
(52) U.S. Cl. ............... 365/222; 365/230.03; 365/227; 365/226
(58) Field of Classification Search ............ 365/230.03, 365/227, 226, 222
See application file for complete search history.

(56) References Cited

U.S. PATENT DOCUMENTS

| 6,178,130 B1 * | 1/2001 | Tsern et al. ............... 365/222 |
| 6,381,188 B1 | 4/2002 | Choi et al. |
| 7,263,020 B2 * | 8/2007 | Pyo et al. ................. 365/222 |
| 2002/0031030 A1 | 3/2002 | Choi et al. |
| 2004/0022085 A1 | 2/2004 | Parkinson et al. |
| 2004/0057315 A1 * | 3/2004 | Jain ........................ 365/222 |
| 2004/0170060 A1 | 9/2004 | Ishimoto |
| 2008/0094931 A1 * | 4/2008 | Pyo et al. ................. 365/222 |

FOREIGN PATENT DOCUMENTS

| JP | 2004-259144 | 9/2004 |
| KR | 100355226 A | 10/2002 |
| KR | 1020050010655 | 1/2005 |
| KR | 10-2006-0020286 | 3/2006 |
| KR | 10-2006-0079646 | 7/2006 |

* cited by examiner

*Primary Examiner*—Andrew Q Tran
(74) *Attorney, Agent, or Firm*—Mills & Onello, LLP

(57) ABSTRACT

The present invention provides a memory device which comprises a memory cell array having a plurality of memory blocks; a memory controller for controlling a refresh operation with respect to the memory blocks; a refresh check bit circuit for storing refresh check bits corresponding to the memory blocks, respectively; a block select control circuit for setting refresh check bits of memory blocks to be refreshed to a checked state according to a first control of the memory controller; a using check bit circuit for storing using check bits corresponding to the memory blocks, respectively; a using check control circuit for setting refresh check bits of memory blocks to which access is requested to a checked state according to a second control of the memory controller; and a partial refresh control circuit for controlling the refresh operation such that memory blocks corresponding to checked using check bits or checked refresh check bits are refreshed according to a third control of the memory controller.

24 Claims, 7 Drawing Sheets

Fig. 5

| Memory Block | Using Check Bits |
|---|---|
| 0 | V |
| 1 |  |
| 2 | V |
| 3 | V |
| 4 |  |
| 5 |  |
| 6 |  |
| 7 | V |
| 8 |  |
| 9 |  |
| 10 |  |
| 11 |  |
| 12 | V |
| 13 |  |
| 14 | V |
| 15 | V |

Fig. 6

| Memory Block | Refresh Check Bits | Using Check Bits |
|---|---|---|
| 0 | V | V |
| 1 | V | |
| 2 | V | V |
| 3 | V | V |
| 4 | | |
| 5 | | |
| 6 | | |
| 7 | | V |
| 8 | | |
| 9 | | |
| 10 | | |
| 11 | | |
| 12 | | V |
| 13 | | |
| 14 | | V |
| 15 | | V | ns
MEMORY DEVICE PERFORMING A PARTIAL REFRESH OPERATION BASED ON ACCESSED AND/OR REFRESHED MEMORY BLOCKS AND METHOD THEREOF

CROSS-REFERENCE TO RELATED APPLICATIONS

This U.S non-provisional patent application claims priority under 35 U.S.C §119 of Korean Patent Application 10-2006-0101454 filed in the Korean Intellectual Property Office on Oct. 18, 2006, the entire contents of which are hereby incorporated by reference.

BACKGROUND OF THE INVENTION

The present invention relates to a dynamic random access memory (DRAM) device and, more particularly, to a DRAM device capable of performing a partial refresh operation and a method thereof.

In general, a DRAM device consists of memory cells each of which consists of a capacitor and a transistor. Data is stored in a capacitor of each memory cell. Data stored in a capacitor is lost due to a decrease in charges in the capacitor according to leakage over time. Accordingly, the DRAM device has a disadvantage that data stored in the capacitor can be lost as time elapses. In order to solve such a problem, the DRAM device necessitates a refresh operation in which data in memory cells is retained through periodic amplification.

In the event that a system operates in a normal mode, a DRAM device may store or read data in or from memory cells in response to a read/write access command. After such accesses, a DRAM device may perform a refresh operation. In general, a refresh operation may be carried out with respect to all memory cells regardless of whether data is stored or not. Since a refresh operation is carried out with respect to memory cells that do not store data to be retained, unnecessary power may be consumed.

SUMMARY OF THE INVENTION

According to a first aspect, the present invention is directed to a memory device comprising a memory cell array having a plurality of memory blocks. A memory controller controls a refresh operation with respect to the memory blocks. A refresh check bit circuit stores refresh check bits corresponding to the memory blocks, respectively. A block select control circuit sets refresh check bits of memory blocks to be refreshed to a checked state according to a first control signal of the memory controller. A using check bit circuit stores using check bits corresponding to the memory blocks, respectively. The using check bits indicate blocks to which access is requested. A using check control circuit sets refresh check bits of memory blocks to which access is requested to a checked state according to a second control signal of the memory controller. A partial refresh controller controls the refresh operation such that memory blocks corresponding to checked using check bits or checked refresh check bits are refreshed according to a third control signal of the memory controller. In one embodiment, the memory device may be used as an internal memory of a system on chip.

In one embodiment, the using check control circuit comprises using check circuits corresponding to the using check bits, respectively. The using check circuits can be configured to reset corresponding using check bits according to the second control signal of the memory controller. Each of the using check circuits can comprise: a first check signal generator for generating a first check signal in response to an access signal, a block address, and a checking start signal as the second control signal from the memory controller; a second check signal generator for generating a second check signal in response to the block address, the checking start signal, and a checking reset signal from the memory controller; and a third check signal generator for setting a corresponding using check bit to a checked state in response to the first and second check signals. The access signal is activated when a selected memory block is access requested. The first check signal generator can activate the first check signal when the block address is an address of a selected memory block and the access and check start signals are activated. The second check signal generator can inactivate the second check signal when the checking start signal is activated. The third check signal generator can be configured to set a corresponding using check bit to a checked state in response to the activated first check signal and the inactivated second check signal.

In one embodiment, the checking reset signal is selectively activated after the checking start signal is inactivated. The second check signal generator can activate the second check signal in response to the inactivated checking reset signal. The third check signal generator can reset a using check signal corresponding to a selected memory block in response to the activated second check signal.

In one embodiment, the third check signal generator is configured to reset a corresponding using check bit in response to a reset signal as a fourth control signal from the memory controller.

In one embodiment, the partial refresh control circuit comprises: a plurality of block address comparators, each comparing a corresponding block address, a corresponding using check bit and a corresponding refresh check bit; and a refresh command signal transferor for selectively outputting a refresh command signal from the memory controller in response to comparison results and a partial refresh start signal from the memory controller. Each of the block address comparators can output an activated comparison output signal when the corresponding block address is an address of a selected memory block and the corresponding using check bit or refresh check bit is set to a checked state. The refresh command signal transferor can send the refresh command signal to the selected memory block in response to the activated partial refresh start signal and at least one activated comparison output signal of the comparison output signals.

In one embodiment, each of the block address comparators outputs an inactivated comparison output signal when the corresponding block address is an address of a selected memory block and corresponding using check bit and refresh check bit are set to a checked state. The refresh command signal transferor can prevent the refresh command signal from being transferred to the selected memory block in response to the activated partial refresh start signal and the inactivated comparison output signal.

According to another aspect, the present invention is directed to a refresh method of a memory device comprising: setting refresh check bits corresponding to memory blocks to be refreshed to a checked state in response to a first control signal of a memory controller; setting using check bits corresponding to memory blocks to be accessed to a checked state in response to a second control signal of the memory controller; and controlling a refresh operation such that memory blocks to checked using check bits or checked refresh check bits are refreshed in response to a third control signal of the memory controller.

In one embodiment, setting using checks bits comprises: generating a first check signal in response to an access signal, a block address, and a checking start signal as the second control signal from the memory controller; generating a second check signal in response to the block address, the checking start signal, and a checking reset signal from the memory controller; and setting a corresponding using check bit to a checked state in response to the first and second check signals. The access signal is activated when a selected memory block is access requested. The first check signal can be activated when the block address is an address of a selected memory block and the access and check start signals are activated. The second check signal can be inactivated when the checking start signal is activated. A using check bit can be set to a checked state according to the activated first check signal and the inactivated second check signal.

In one embodiment, the checking reset signal is selectively activated after the checking start signal is inactivated. The method may further include activating the second check signal in response to the inactivated checking reset signal. The method may further include resetting a using check signal corresponding to a selected memory block in response to the activated second check signal.

In one embodiment, the method further includes resetting a using check bit in response to a reset signal as a fourth control signal from the memory controller.

In one embodiment, controlling corresponding memory blocks comprises: comparing a block address, a using check bit and a refresh check bit; and selectively outputting a refresh command signal from the memory controller in response to a comparison result and a partial refresh start signal from the memory controller. An activated comparison output signal can be output when the block address is an address of a selected memory block and the using check bit or refresh check bit is set to a checked state. The refresh command signal can be sent to the selected memory block in response to the activated partial refresh start signal and the activated comparison output signal. An inactivated comparison output signal can be output when the block address is an address of a selected memory block and the using check bit and refresh check bit are set to a checked state. The refresh command signal can be prevented from being transferred to the selected memory block in response to the activated partial refresh start signal and the inactivated comparison output signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 5 is a diagram showing a check state of a using check bit according to the present invention.

FIG. 6 is diagram showing check states of a refresh check bit and a using check bit according to the present invention.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

A memory device according to the present invention is configured to selectively perform a refresh operation with respect to only memory blocks to be refreshed. Accordingly, it is possible to reduce power consumption in a refresh operation of a memory device according to the present invention.

Figure 1:
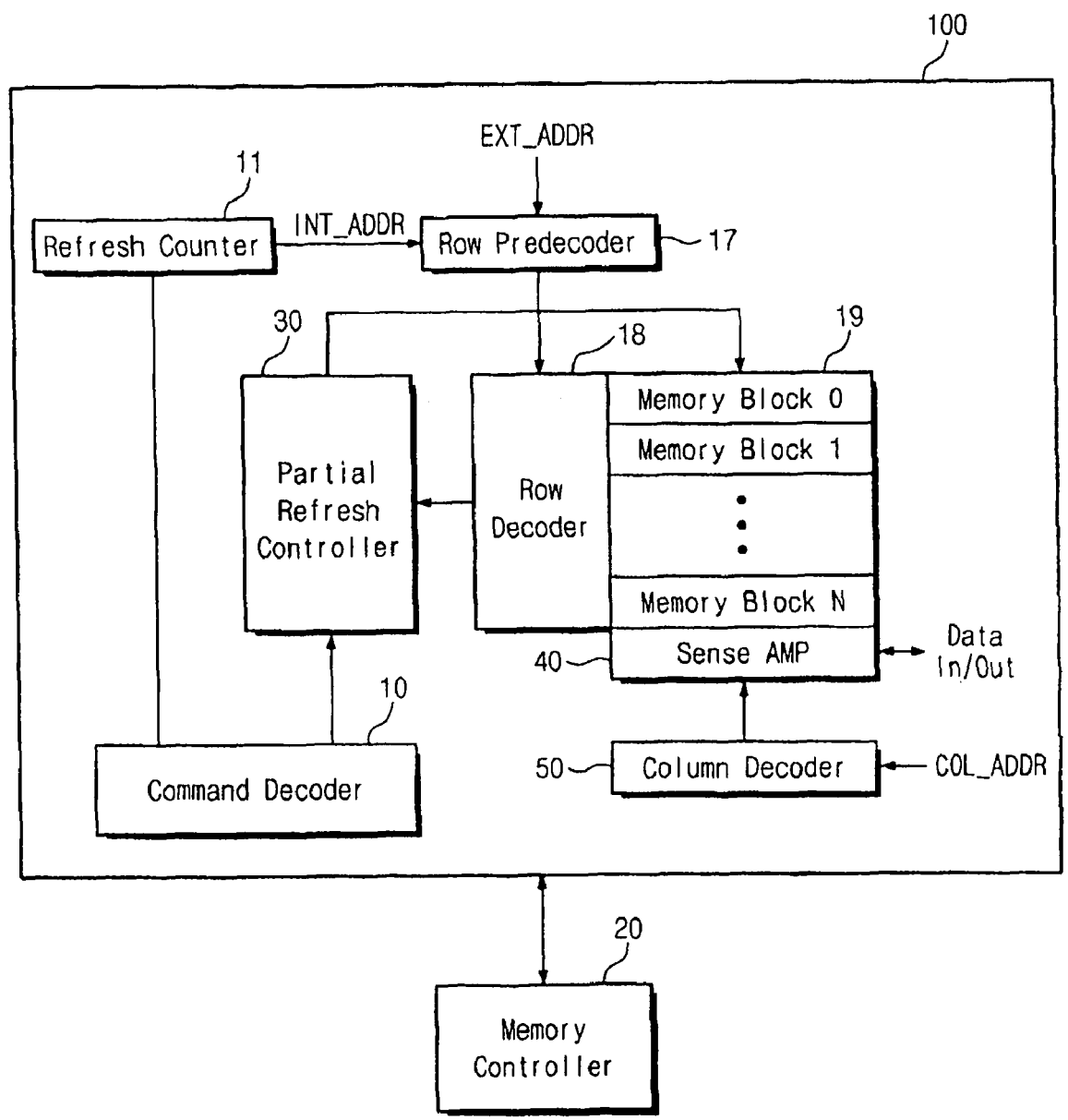
FIG. 1 is a block diagram showing a dynamic random access memory (DRAM) system having a dynamic random access memory 100 according to an embodiment of the present invention.

FIG. 1 is a block diagram showing a dynamic random access memory (DRAM) system having a dynamic random access memory 100 according to an embodiment of the present invention.

Referring to FIG. 1, the dynamic random access memory 100 is controlled by a memory controller 20. The dynamic random access memory 100 may include a command decoder 10, a refresh request counter 11, a row pre-decoder 17, a row decoder 18, a memory cell array 19, a sense amplifier 40, a column decoder 50, and a partial refresh controller 30.

The memory cell array 19 may consist of banks each of which having one or more blocks. One bank having plural memory blocks (e.g., N Memory Blocks) is illustrated in FIG. 1, but it is obvious to those skilled in the art that the memory cell array 19 is composed of plural banks. The command decoder 10 generates commands in response to control signals from the memory controller 20. The dynamic random access memory 100 is operated in response to the generated command.

In a normal operation, an external address EXT_ADDR is decoded by the row pre-decoder 17 and the row decoder 18. A word line corresponding to the decoded external address EXT_ADDR is activated. A column address COL_ADDR is decoded by the column decoder 50. The sense amplifier 40 connected to the memory cell array 19 senses and amplifies data from a selected cell in response to a decoded column address COL_ADDR.

In a read operation, data read from the memory cell array 19 may be provided from the sense amplifier 40 to the memory controller 20.

In a write operation, the sense amplifier 40 is provided data from the memory controller 20. The provided data is stored to a selected cell by the sense amplifier 40.

In a refresh operation, the partial refresh controller 30 performs a refresh operation only with respect to blocks requiring a refresh operation in response to the command. This is referred to as a partial refresh operation. According to the partial refresh operation, the dynamic random access memory 100 can perform a partial refresh operation. Thus, it is possible to reduce power consumption. Hereinafter, the partial refresh operation will be described in detail.

The dynamic random access memory 100 may be used as an internal memory. For example, the dynamic random access memory 100 can be constructed as an internal memory of a system on chip (SOC).

Figure 2:
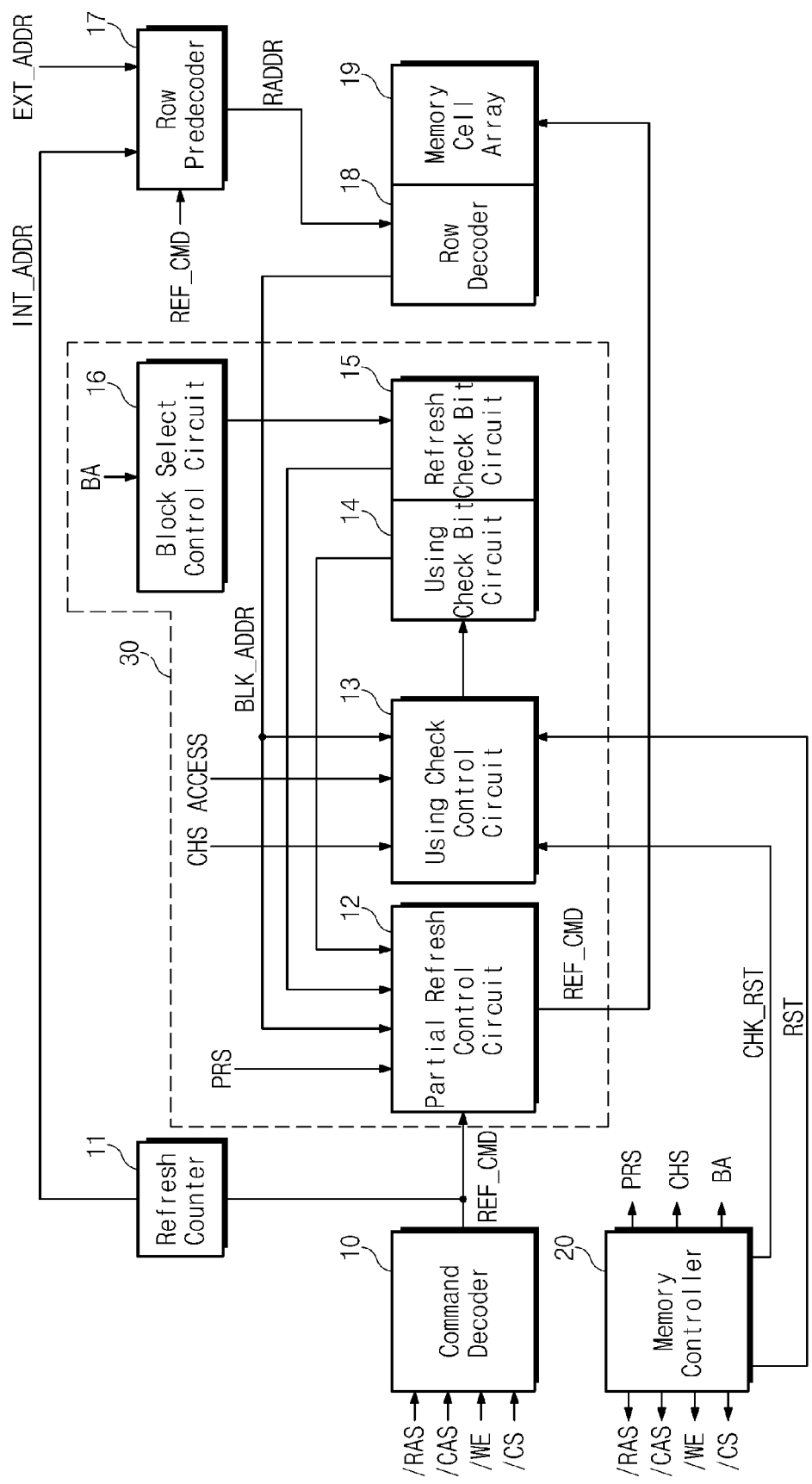
FIG. 2 is a block diagram showing the partial refresh controller illustrated in FIG. 1.

FIG. 2 is a block diagram showing the partial refresh controller illustrated in FIG. 1.

Referring to FIG. 2, the partial refresh controller 30 according to the present invention includes a partial refresh control circuit 12, a using check control circuit 13, a using check bit circuit 14, a refresh check bit circuit 15, and a block select control circuit 16.

The memory cell array 19 may consist of banks each of which having one or more blocks. A memory controller 20 may generate control signals for controlling a refresh operation with respect to the blocks of the memory cell array 19.

The partial refresh control circuit 12 may control whether a refresh operation is performed with respect to a selected block of the memory cell array 19. The using check control circuit 13 may control checking of bits of the using check bit circuit 14, based on whether the memory device 100 is accessed externally. The using check bit circuit 14 may include storages corresponding to blocks in the memory cell array 19. The respective storages store bits corresponding to the blocks (hereinafter, referred to as using check bits), which indicate for which access is requested in the memory cell array 19, respectively.

The refresh check bit circuit 15 may include storages corresponding to blocks in the memory cell array 19. The respective storages store bits corresponding to the blocks (hereinafter, referred to as refresh check bits). The refresh check bit circuit 15 may check blocks in the memory cell array 19 to be used by the block select control circuit 16 before the memory device 100 is accessed. Blocks of the memory cell array corresponding to checked refresh check bits are blocks to which refresh is requested at a refresh operation of the dynamic random access memory 100. The block select control circuit 16 may control checking of refresh check bits in the refresh check bit 15 according to the control of a mode register set (MRS) (not shown) or the memory controller 20.

The command decoder 10 may generate a command in response to control signals /RAS, /CAS, /WE, and /CS from the memory controller 20. The control signal /CS is a chip select signal, the /RAS is a row address strobe signal, the /CAS is a column address strobe signal, and the /WE is a write enable signal. The dynamic random access memory 100 may perform a refresh operation when the control signals /RAS, /CAS, and /WE have a low level, a low level, and a high level, respectively. Accordingly, the command decoder 10 may generate a refresh command REF_CMD the control signal /RAS of a low level, the control signal /CAS of a low level, and the control signal /WE of a high level. That is, it is considered that the refresh command may be generated from the memory controller 20 because it is made by combination of the control signals /RAS, /CAS, and /WE from the memory controller 20.

The refresh counter 11 may generate an internal address INT_ADDR in response to the refresh command REF_CMD from the command decoder 10 and provide it to the row pre-decoder 17.

The row pre-decoder 17 may operate responsive to the refresh command REF_CMD and receive an external address EXT_ADDR from the exterior at a normal operation or the internal address INT_ADDR from the refresh counter 11 at a refresh operation. The row pre-decoder 17 may decode the received external or internal address EXT_ADDR or INT_ADDR to generate a row address RADDR, which is provided to the row decoder 18.

The row decoder 18 may receive the row address RADDR from the row pre-decoder 17 and decode the received row address RADDR so as to select blocks in respective banks of the memory cell array 19. That is, the row pre-decoder 17 decodes an address in bank unit (e.g., a bank address) and the row decoder 18 decodes the decoded address in block unit (e.g., a block address).

The block select control circuit 16 may control checking of refresh check bits in the refresh check bit circuit 15 according to the control of MRS (not shown) or the memory controller 20 before using the memory. For example, the block select control circuit 16 may check refresh check bits corresponding to address information BA of a memory block from the memory controller 20 or MRS. The checked refresh check bits become a high level, respectively.

The refresh check bits checked by the block select control circuit 16 may indicate blocks in the memory cell array 19 that are to be refreshed at a refresh operation of the dynamic random access memory 100. Accordingly, at a refresh operation, blocks in the memory cell array 19 are refreshed which correspond to the checked refresh check bits. The refresh check bits in the refresh check bit circuit 15 may be checked in a bank unit. For example, in the event that the memory cell array 19 may include four banks each of which has four memory blocks, if a first bank is selected by the block select control circuit 16, there are checked refresh check bits in the refresh check bit circuit 15 that correspond to memory blocks in the first bank.

The using check control circuit 13 receives a checking start signal CHS, a reset signal RST, and a check reset signal CHK_RST. Further, the using check control circuit 13 receives an access signal ACCESS, which is activated when the memory cell array 19 is accessed from the exterior, and a decoded block address BLK_ADDR from the row decoder 18. The using check control circuit 13 may control checking of each using check bit of the using check bit 14.

At a normal operation, the access signal ACCESS is activated when a block in the memory cell array 19 corresponding to the decoded block address BLK_ADDR is activated high.

At a normal operation, when the signals RST and CHK_RST are inactivated low and the checking start signal CHS is activated high, if the access signal ACCESS is activated, the using check control circuit 13 checks a using check bit of the using check circuit 14 corresponding to the received block address BLK_ADDR. A block corresponding to the checked using check bit may be a block that necessitates retaining of data to a region to which access is requested. Accordingly, a block corresponding to a checked using check bit is requested to be refreshed.

In the event that a received checking start signal CHS is inactivated low, the using check control circuit 13 does not check using check bits in the using check bit circuit 14, regardless of whether the memory cell array 19 is requested to be accessed from the exterior. In the event that the dynamic random access memory 100 performs a refresh operation, an access from the exterior may be ignored. Accordingly, the using check control circuit 13 does not check using check bits unless a received checking start signal CHS is activated high.

The reset signal RST is used to reset all using check bits in the using check bit circuit 14. The using check control circuit 13 may reset all using check bits in the using check bit circuit 14 when the reset signal RST is activated high. The reset using check bits may become a low level, respectively.

The checking reset signal CHK_RST is a signal for resetting a using check bit in the using check bit circuit 14 corresponding to a selected block. That is, a using check bit in the using check bit circuit 14 is reset which corresponds to a block selected by the checking reset signal CHK_RST. When the checking reset signal CHK_RST is activated high, the using check control circuit 13 resets a using check bit in the using check bit circuit 14 corresponding to a block selected by the row decoder 18. In the event that the using check control circuit 13 receives a checking start signal CHS of a high level, the checking reset signal CHK_RST is not activated. In the event that the using check control circuit 13 receives the checking start signal CHS of a low level, that is, in the event that the using check control circuit 13 does not check using check bits, the checking reset signal CHK_RST may be activated.

The using check control circuit 13 may control whether using check bits in the using check bit circuit 14 are checked. Using check bits checked by the using check control circuit 13 indicate blocks to be refreshed at a refresh operation, respectively.

The partial refresh control circuit 12 may receive a partial refresh start signal PRS as a control signal generated by the memory controller 20. The partial refresh control circuit 12 may receive the refresh command REF_CMD, a block address BLK_ADDR decoded by the row decoder 18, a bit in the using check bit circuit 14 corresponding to the decoded block address BLK_ADDR, and bit information of the refresh check bit circuit 15 corresponding to the decoded block address BLK_ADDR. The partial refresh control circuit 12 may transfer the refresh command REF_CMD to the memory cell array 19 when the partial fresh start signal PRS is activated high and a using check bit or a refresh check bit is checked. A block selected by the row decoder 18 is refreshed according to the refresh command REF_CMD.

In the event that the dynamic random access memory 100 performs a refresh operation, the command decoder 10 may generate the refresh command REF_CMD in response to control signals /RAS, /CAS, /WE, and /CS from the memory controller 20. The refresh command REF_CMD is transferred to the refresh counter 11, the partial refresh control circuit 12, and the row pre-decoder 17.

In a case where the dynamic random access memory 100 carries out a refresh operation, the refresh counter 11 generates an internal address INT_ADDR in response to the refresh command REF_CMD from the command decoder 10. The internal address INT_ADDR is supplied to the row pre-decoder 17.

When the dynamic random access memory 100 makes a refresh operation, the row pre-decoder 17 receives the internal address INT_ADDR from the refresh counter 11 in response to the refresh command REF_CMD. The row pre-decoder 17 generates a row address RADDR in response to the internal address INT_ADDR. The row address RADDR is supplied to the row decoder 18. The row decoder 18 decodes the row address RADDR so as to select blocks in respective banks of the memory cell array 19. One block in the memory cell array 19 is selected by the decoded block address BLK_ADDR, which is transferred to the using check control circuit 13 and the partial refresh control circuit 12.

At a normal operation of the dynamic random access memory 100, the row pre-decoder 17 is controlled by the refresh command REF_CMD and decodes an external address EXT_ADDR to generate a row address RADDR. The row address RADDR is sent to the row decoder 18.

At a normal operation of the dynamic random access memory 100, the using check control circuit 13 receives the decoded block address BLK_ADDR from the row decoder 18. when the checking start signal CHS has a high level, the using check control circuit 13 checks whether a block selected by the decoded block address BLK_ADDR is accessed by the external. If so, a using check bit in the using check bit storing part corresponding to the block address BLK_ADDR is checked. A block corresponding to the checked using check bit is a region accessed by the external and necessitating retaining of data. Accordingly, a block corresponding to the checked using check bit is a block to which a refresh operation is required.

In the event that a received checking start signal CHS is inactivated low, the using check control circuit 13 does not check using check bits in the using check bit circuit 14, regardless of whether the memory cell array 19 is requested to be accessed from the exterior. In the event that the dynamic random access memory 100 performs a refresh operation, an access from the external may be ignored. Accordingly, the using check control circuit 13 does not check using check bits although a received checking start signal CHS is activated high.

During a refresh operation, the row pre-decoder 17 receives an internal address INT_ADDR from the refresh counter 11 in response to the refresh command REF_CMD and decodes the received internal address INT_ADDR to generate a row address RADDR. The row decoder 18 may receive the row address RADDR from the row pre-decoder 17 and decode the received row address RADDR so as to select blocks in respective banks of the memory cell array 19.

In the event that the dynamic random access memory 100 performs a refresh operation, the partial refresh control circuit 12 receives a partial refresh start signal PRS of a high level. The partial refresh control circuit 12 receives the refresh command REF_CMD, a block address BLK_ADDR decoded by the row decoder 18, a using check bit in the using check bit circuit 14 corresponding to the decoded block address BLK_ADDR, and refresh check bit information of the refresh check bit circuit 15.

In the event that the dynamic random access memory 100 performs a refresh operation, if a received using check bit or refresh check bit is checked, the partial refresh control circuit 12 sends the refresh command REF_CMD to the memory cell array 19 in response to the partial refresh start signal PRS of a high level. Accordingly, if at least one of a using check bit and a refresh check bit corresponding to a block address BLK_ADDR is checked, a block selected by the row decoder 18 is refreshed according to the refresh command REF_CMD. Thus, the partial refresh control circuit 12 may control a refresh operation of respective blocks of the memory cell array 19.

When the checking start signal CHS of a low level is received, the using check control circuit 13 does not check using check bits in the using check bit circuit 14. In a case where using check bits are not checked, the partial refresh control circuit 12 performs a refresh operation with respect to blocks corresponding to previously checked refresh check bits in the refresh check bit circuit 15.

As a result, the dynamic random access memory 100 performs a refresh operation only with respect to blocks necessitating a refresh operation at a refresh operation.

Figure 3:
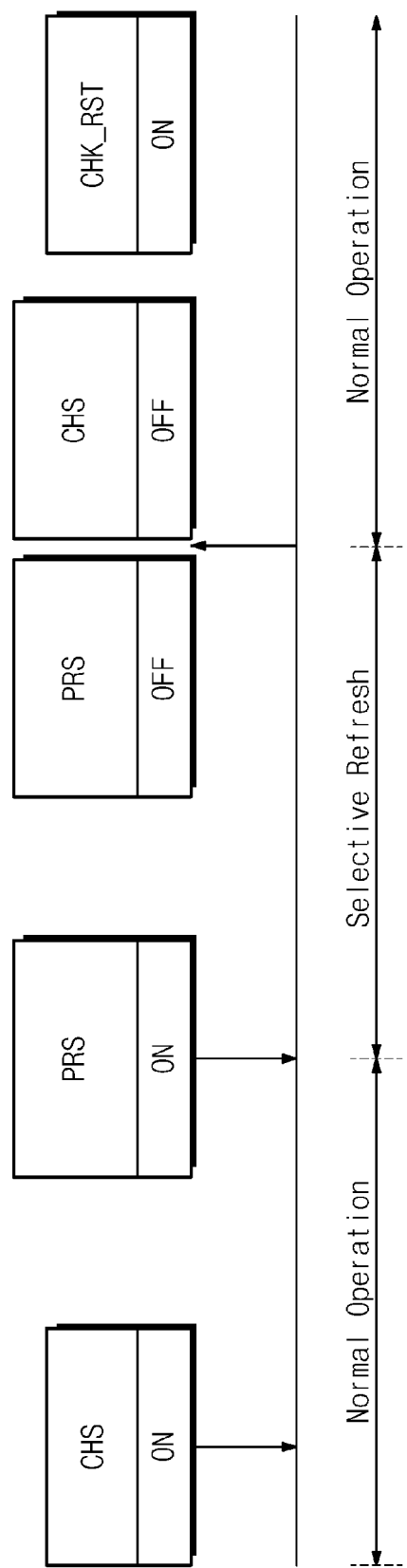
FIG. 3 is a diagram illustrating an operation of a DRAM according to a checking start signal and a partial refresh start signal.

FIG. 3 is a diagram illustrating an operation of a dynamic random access memory based on a checking start signal and a partial refresh start signal.

Referring to FIG. 3, a using check control circuit 13 of the present invention operates responsive to a checking start signal CHS of a high level (an on state) and checks respective using check bits in a using check bit circuit 14 according to whether or not respective blocks in a memory cell array 19 are being accessed.

During a refresh operation, the partial refresh control circuit 12 receives a partial refresh start signal of a high level (an on state). If a using check bit in the using check bit storing circuit 12 or a refresh check bit in the refresh check bit circuit 15 is checked, the partial refresh control circuit 12 controls a refresh operation with respect to a block corresponding to the checked bit.

In the event that the dynamic random access memory 100 performs a refresh operation, it performs a refresh operation without access request from the exterior. Thus, the using check control circuit 13 does not check a using check bit in the using check bit circuit 14 although a checking start signal CHS of a high level is input.

When a refresh operation is ended, the partial refresh control circuit 12 receives the partial refresh start signal PRS of a low level (an off state) and does not perform a partial refresh operation. At this time, the using check control circuit 13 does not check using check bits in the using check bit circuit 14 in response to a checking start signal CHS of a low level (an off state). Afterward, at a normal operation, the checking reset signal CHK_RST may be activated. That is, the checking reset signal CHK_RST may be activated after the using check control circuit 13 receives the checking start signal CHS of a low level. In a case where the checking reset signal CHK_RST is activated high, the using check control circuit 13 resets a using check bit in the using check bit storing circuit 13 corresponding to a block selected by a block address BLK_ADDR. The using check bit is reset to a low level.

Figure 4:
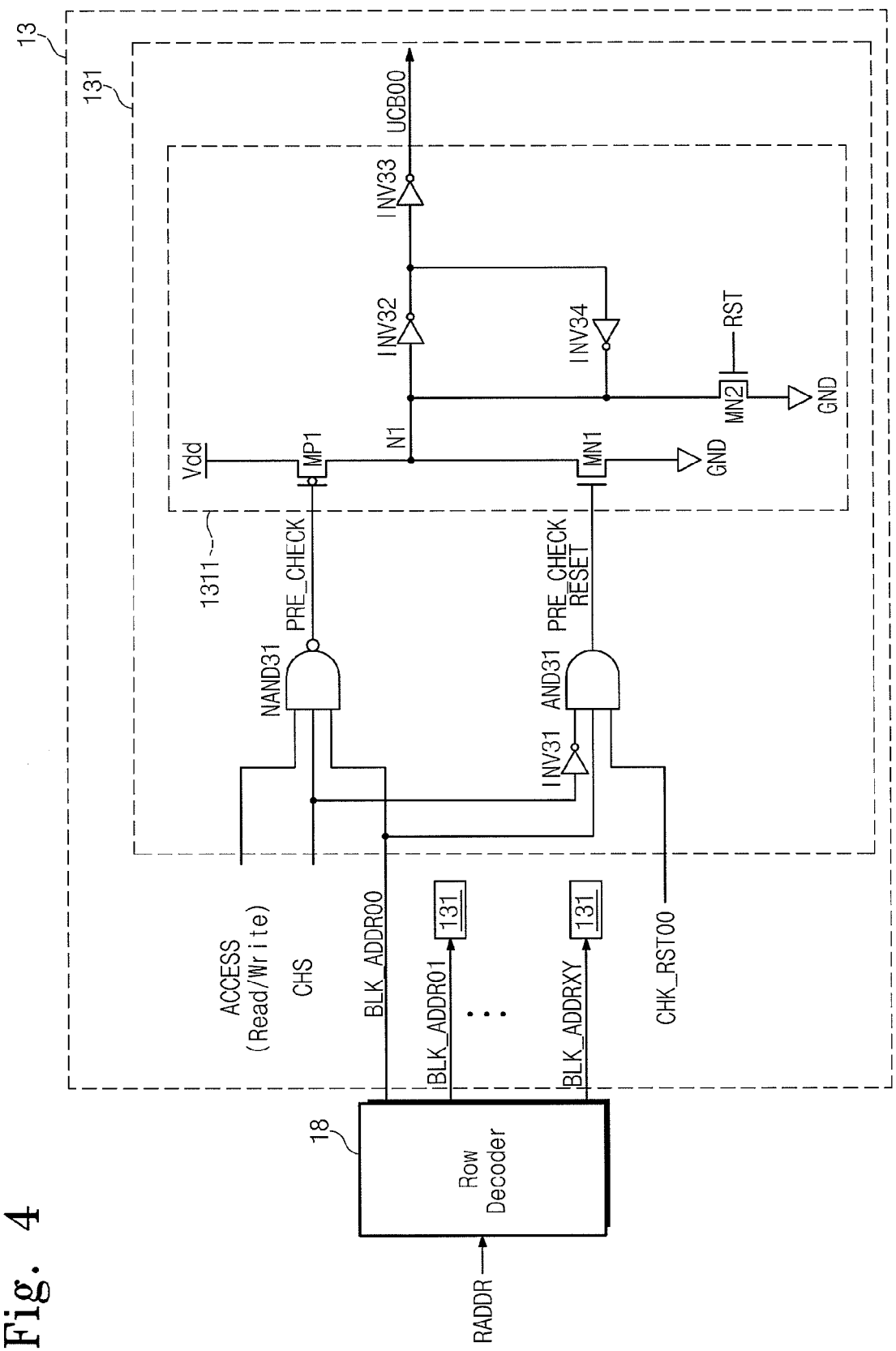
FIG. 4 is a circuit diagram showing a using check control circuit illustrated in FIG. 2.

FIG. 4 is a circuit diagram of a using check bit control circuit illustrated in FIG. 2, and FIG. 5 is a table showing check states of using check bits according to one embodiment of the present invention.

In FIG. 4, only one circuit 131 (hereinafter, referred to as a using check circuit) is illustrated, but a using check control circuit 13 may be configured to include the using check circuit 131 so as to correspond to using check bits in a using check bit circuit 14, respectively. For example, in a case where a memory cell array 19 includes 16 blocks, the using check bit circuit 14 may include 16 storages (not shown), which store using check bits, respectively. Accordingly, the using check control circuit 13 may include 16 using check circuits illustrated in FIG. 4. The using check control circuit 13 receives block address BLK_ADDR00 to BLK_ADDRXY and checking reset signals CHK_RST00 to CHK_RSTXY) that correspond to using check circuits 131, respectively. A block address BLK_ADDR decoded by a row decoder 18 may consist of block addresses BLK_ADDR00 to BLK_ADDRXY. The using check circuits 131 are commonly supplied with a reset signal RST.

The using check circuits 131 are configured and operate identically to each other. For ease of description, an operation of a using check circuit 131 will be described under the assumption that a first block in the memory cell array 19 is selected according to block addresses BLK_ADDR00 to BLK_ADDRXY decoded by the row decoder 18.

Referring to FIG. 4, the using check circuit 131 according to the present invention includes an inverter INV31, a NAND gate NAND31 operating as a first check signal generator, an AND gate AND31 operating as a second check signal generator, and a check signal generating part 1311. The check signal generating part 1311 includes inverters INV32, INV33, and INV34, a PMOS transistor MP1, and an NMOS transistor MN1 and MN2.

A first input terminal of the NAND gate NAND31 receives an access signal ACCESS, a second input terminal thereof receives a checking start signal CHS, and a third input terminal thereof receives a block address BLK_ADDR00. The AND gate AND31 has a first input terminal receiving an inverted checking start signal /CHS via the inverter INV31, a second input terminal receiving the block address BLK_ADDR, and a third input terminal receiving the checking reset signal CHK_RST00.

The NAND gate NAND31 combines the received signals ACCESS, CHS, and BLK_ADDR00 to output a first check signal PRE_CHECK to the check signal generating part 1311 as a combination result. The first check signal PRE_CHECK is applied to a gate of the PMOS transistor MP1 in the check signal generating part 1311. The AND gate AND31 combines the received signals /CHS, BLK_ADDR00, and CHK_REST00 to output a second check signal PRE_CHECK_RESET to the check signal generating part 1311 as a combination result. The second check signal PRE_CHECK_RESET is applied to a gate of the NMOS transistor MN1 in the check signal generating part 1311.

A source of the PMOS transistor MP1 in the check signal generating part 1311 is connected to an operation voltage Vdd, and its gate is connected to receive the first check signal PRE_CHECK, and its drain is connected to a node N1. A gate of the NMOS transistor MN1 is connected to receive the second check signal PRE_CHECK_RESET, its source is connected to a ground voltage GND, and its drain is connected to the node N1. A gate of the NMOS transistor MN2 is connected to receive a reset signal RST, its drain is connected to the node N1, and its source is connected to a ground voltage GND.

A voltage of the node N1 may be determined through the PMOS and NMOS transistors MP1 and MN1. The voltage of the node N1 thus determined is latched by the inverters INV32 and INV34, and is transferred as a using check bit UCB00 of the using check bit circuit 14 corresponding to the block address BLK_ADDR00 via the inverters INV32 and INV33. The using check bit UCB00 indicates an on state (or a checked state) when a voltage of the node N1 has a high level, and an off state when a voltage of the node N1 has a low level. This means that a checked using check bit has a high level.

An operation of the using check control circuit 13 will be more fully described with reference to FIGS. 4 and 5.

At a normal operation, a row pre-decoder 17 receives an external address EXT_ADDR according to the control of a refresh command REF_CMD and decodes the received external address EXT_ADDR to generate a row address RADDR.

A row decoder 18 receives the row address RADDR from the row pre-decoder 17 and decodes the received row address RADDR so as to select blocks in respective banks of a memory cell array 19. Decoded block addresses BLK_ADDR00 to BLK_ADDRXY from the row decoder 18 are sent to corresponding using check circuits 131 in a using check control circuit 13, respectively.

In a case where a first block is selected according to the decoded block addresses BLK_ADDR00 to BLK_ADDRXY, a block address BLK_ADDR00 has a high level and remaining block addresses BLK_ADDR01 to BLK_ADDRXY have a low level, respectively. The block address BLK_ADDR00 of a high level is supplied to a third input terminal of a NAND gate NAND31 in the using check circuit 131 and a second input terminal of an AND gate AND31. Each of the block addresses BLK_ADDR01 to BLK_ADDRXY may be sent to a corresponding using check circuit 131 in the using check control circuit 13.

At a normal operation, if the using check control circuit 13 receives a checking start signal CHS of a high level in order to check using check bits of a using check bit circuit 14, the checking start signal CHS of a high level is applied to a second input terminal of the NAND gate NAND31 in the using check circuit 131. The checking start signal CHS of a high level is inverted via an inverter INV31, and the inverted checking start signal /CHS is applied to a first input terminal of the AND gate AND31. At this time, the using check control circuit 13 receives the checking start signal CHS, which is applied to a third input terminal of the AND gate AND31 in the using check circuit 131. Since the checking start signal CHS has a high level, the checking reset signal CHK_RST00 goes to a low level.

When a first block in a memory cell array 19 is accessed by the external, an access signal ACCESS becomes a high level. The access signal ACCESS is sent to a first input terminal of the NAND gate NAND31 in the using check circuit 131.

The NAND gate NAND31 combines received signals ACCESS, CHS, and BLK_ADDR00 and outputs a first check signal PRE_CHECK to a check signal generating part 1311 as a combination result. Since the received signals ACCESS, CHS, and BLK_ADDR00 have a high level, respectively, the first check signal PRE_CHECK goes to a low level. The first check signal PRE_CHECK is supplied to a gate of a PMOS transistor MP1 in the check signal generating part 1311.

The AND gate AND31 combines the received signal /CHS, BLK_ADDR00, CHK_RST00 and outputs a second check signal PRE_CHECK_RESET to the check signal generating part 1311 as a combination result. Since the received check reset signal CHK_RST00 has a low level, the second check signal PRE_CHECK_RESET becomes a low level regardless of the remaining signals /CHS and BLK_ADDR00. The second check signal PRE_CHECK_RESET is applied to a gate of an NMOS transistor MN1 in the check signal generating part 1311.

The PMOS transistor MP1 is turned on by the first check signal PRE_CHECK of a low level, and the NMOS transistor MN1 is turned off by the second check signal PRE_CHECK_RESET of a low level. Accordingly, a node N1 becomes a high level of an operation voltage Vdd.

In a case where a reset signal RST is at a low level, an NMOS transistor MN2 is turned off. This means that a high-level signal of the node N1 is held by inverters INV32 and INV34 and that a high-level signal of the node N1 is output as a first using check bit of the using check bit circuit 14 corresponding to the using check circuit 131 via inverters INV32 and INV33.

The first using check bit of the using check bit circuit 14 is checked according to a check signal UCB00 of a high level output from the using check circuit 131. That is, a first using check bit of the using check bit circuit 14 becomes a high level.

At a normal operation, in the event that the check start signal CHS is at a high level, the block address BLK_ADDR00 is at a high level, the checking reset signal CHK_RST00 is at a low level, and a first block in the memory cell array 19 is accessed externally, the access signal ACCESS becomes a low level.

The access signal ACCESS of a low level is applied to a first input terminal of the NAND gate NAND31 in the using check circuit 131, and the checking start signal CHS of a high level is applied to a second input terminal of the NAND gate NAND31. Further, the checking start signal CHS of a high level is inverted via the inverter INV31, and the inverted checking start signal /CHS of a low level is applied to a first input terminal of the AND gate AND31. The block address BLK_ADDR00 of a high level is supplied to a third input terminal of the NAND gate NAND31 and a second input terminal of the AND gate AND31. The checking reset signal CHK_RST00 of a low level is sent to a third input terminal of the AND gate AND31 in the using check circuit 131.

Since one ACCESS of the received signals ACCESS, CHS, and BLK_ADDR00 is at a low level, the NAND gate NAND31 generates the first check signal PRE_CHECK of a high level. The first check signal PRE_CHECK of a high level is applied to a gate of the PMOS transistor MP1 in the check signal generating part 1311.

Since one CHK_RST00 of the received signals /CHS, CHK_RST00, and BLK_ADDR00 is at a low level, the AND gate AND31 generates the second check signal PRE_CHECK_RESET of a low level. The second check signal PRE_CHECK_RESET of a low level is applied to a gate of the NMOS transistor MN1 in the check signal generating part 1311.

The PMOS transistor MP1 of the check signal generating part 1311 is turned off by the first check signal PRE_CHECK of a high level, and the NMOS transistor MN1 is turned off by the second check signal PRE_CHECK_RESET of a low level. Accordingly, the node N1 has a low-level signal. The low-level signal of the node N1 is held by the inverters INV32 and INV34, and is output as a first using check bit of a using check bit circuit 14 corresponding to the using check circuit 131 via the inverters INV32 and INV33. The first using check bit in the using check bit circuit 14 is not checked according to a using check signal UCB00 of a low level. That is, the first using check bit of the using check bit circuit 14 becomes a low level.

As a result, in a case where a selected block in the memory cell array 19 is accessed from the external, a using check bit of the using check bit circuit 14 corresponding to the accessed block is checked by the using check circuit 131 of the using check control circuit 13. A table illustrated in FIG. 5 indicates check states of respective using check bits of the using heck bit circuit 14 and blocks in the memory cell array 19. Using check bits of the using check bit circuit 14 may be checked by corresponding using check circuits 131, respectively. The table in FIG. 5 shows that 0, 2, 3, 7, 12, 14, and 15 blocks are accessed and that using check bits corresponding to the accessed blocks are checked at a high state. Remaining blocks are not accessed, and using check bits of the remaining blocks are not checked or maintained at a low level.

After checking using check bits of using check circuits 131 according to whether respective blocks of the memory cell array 19 are accessed, if the checking start signal CHS goes to a low level, the checking reset signal CHK_RST00 may be activated high. If a first block of the memory cell array 19 is selected and the checking reset signal CHK_RST00 is activated high, a first input terminal of the AND gate AND31 is supplied with a checking start signal /CHS of a high level via the inverter INV31, and a second input terminal thereof is supplied with a block address BLK_ADDR00 of a high level, and a third input terminal thereof is supplied with the checking reset signal CHK_RST00 of a high level.

The AND gate AND31 generates a second check signal PRE_CHECK_RESET of a high level in response to the received signal /CHS, BLK_ADDR0, and CHK_RST00 that have a high level, respectively. The second check signal PRE_CHECK_RESET of a high level is applied to a gate of the NMOS transistor MN1 in the checking signal generating part 1311.

The NMOS transistor MN1 of the check signal generating part 1311 is turned on the second check signal PRE_CHECK_RESET of a high level. Accordingly, current of the node N1 flows to a ground voltage GND via the turned-on NMOS transistor MN1. That is, the node N1 is set to a low level. In a case where a first using check bit UCB00 of the using check bit circuit 14 is checked, since a voltage of the node N1 is set to a low level, the first using check bit UCB00 of the using check bit circuit 14 corresponding to the using check circuit 131 is changed from a high level to a low level.

That is, the first using check bit of the using check bit circuit 14 is reset. Accordingly, after the checking start signal CHS is set to a low level, checked using check bits may be reset selectively by a corresponding checking reset signal CHK_RST00.

In the event that bits of the using check bit circuit 14 are all reset, the using check circuit 131 is supplied with a reset signal RST of a high level, which is applied to a gate of the NMOS transistor MN1 of the check signal generating part 1311 in the using check circuit 131.

The NMOS transistor MN1 of the check signal generating part 1311 is turned on by the reset signal RST of a high level. Accordingly, current of the node N1 flows to a ground voltage GND via the turned-on NMOS transistor MN2, so that a voltage of the node N1 is set to a low level. This forces a first using check bit of the using check bit circuit 14 corresponding to the using check circuit 131 to become a low level. That is, the first check bit of the using check bit circuit 14 is reset. Using check circuits 131 of the using check control circuit 12 are supplied with the reset signal RST in common. Accordingly, when the reset signal RST of a high level is received, the using check circuits 131 reset corresponding using check bits. As a result, when the reset signal RST of a high level is applied to the using check circuits 131, all using check bits in the using check bit circuit 14 is set to a low level.

FIG. 6 is a table showing check states of refresh check bits and using check bits according to one embodiment of the present invention.

Referring to FIG. 6, in a case where a memory cell array 19 includes four banks and each bank includes four memory blocks, the memory cell array 19 may include 16 memory blocks. There are checked refresh check bits of a refresh check bit circuit 15 corresponding to blocks 0, 1, 2, and 3 in the memory cell array 19. Checked refresh check bits are bits that are previously checked to determine blocks in the memory cell array 19 to be refreshed.

Blocks 0, 2, 3, 7, 12, 14, and 15 in the memory cell array 19 are accessed externally, and using check bits of a using check bit circuit 14 corresponding to accessed blocks are checked. Checked refresh check bits and using check bits indicate blocks to be refreshed at a refresh operation.

Figure 7:
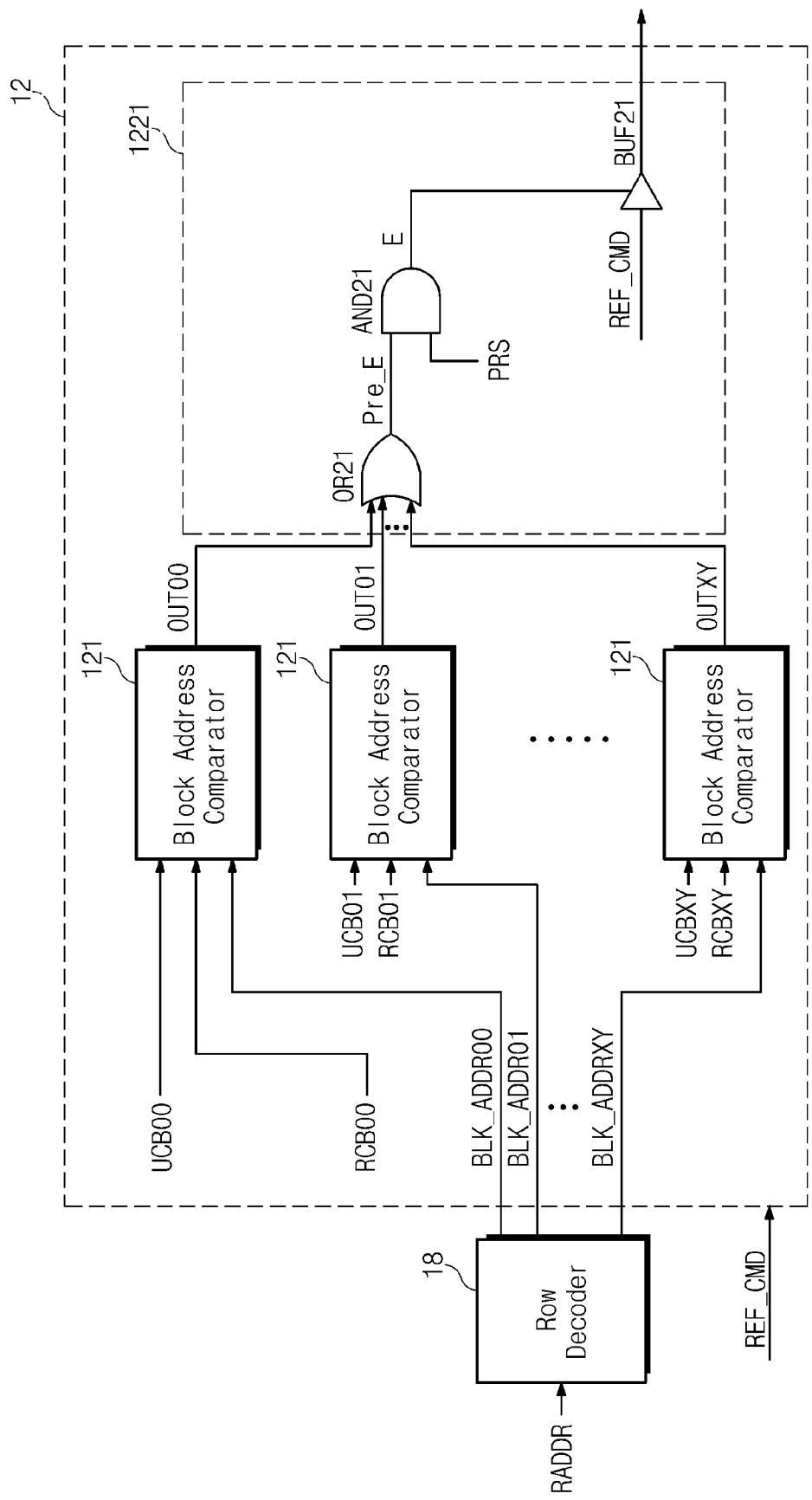
FIG. 7 is a diagram showing a partial refresh control circuit illustrated in FIG. 2.

FIG. 7 is a block diagram showing a partial refresh control circuit illustrated in FIG. 2.

Referring to FIG. 7, a partial refresh control circuit 12 may include a block address comparator 121 and a refresh command signal transfer part 122. The refresh command signal transfer part 122 has an OR gate OR21, an AND gate AND21, and a buffer BUF21.

In the event that a dynamic random access memory 100 performs a refresh operation, the partial refresh control circuit 12 receives using check bits UCB00 to UCBXY of a using check bit circuit 14, refresh check bits RCB00 to RCBXY of a refresh check bit circuit 15, and decoded block addresses BLK_ADDR00 to BLKK_ADDRXY of a row decoder 18. Further, the partial refresh control circuit 12 receives an activated partial refresh start signal PRS and a refresh command REF_CMD.

During a refresh operation, the received using check bits UCB00 to UCBXY, refresh check bits RCB00 to RCBXY, and decoded block addresses BLK_ADDR00 are applied to corresponding block address comparators 121, respectively. Further, the activated refresh start signal PRS is applied to a second input terminal of the AND gate AND21, and the refresh command REF_CMD is transferred to the buffer BUF21 that is controlled by a refresh transfer control signal E.

At a refresh operation, a row pre-decoder 17 generates a row address RADDR in response to an internal address INT_ADDR from a refresh counter 11 according to a refresh command signal REF_CMD. The row address RADDR is transferred to a row decoder 18, which decodes the row address RADDR so as to select blocks in respective banks of a memory cell array 19.

The block address comparators 121 may compare the block addresses BLK_ADDR00 to BLK_ADDRXY, the using check bits UCB00 to UCBXY, and the refresh check bits RCB00 to RCBXY. The block address comparators 121 may be configured to operate the same. Accordingly, a block address comparator 121 will be described under the assumption that a first block of a memory cell array 19 is selected according to decoded block addresses BLK_ADDR00 to BLK_ADDRXY.

If the first block is selected, a block address BLK_ADDR00 is set to a high level, and remaining block addresses are set to a low level. Accordingly, the block address comparator 121 is supplied with the block address BLK_ADDR00 of a high level, and the remaining block address comparators 121 are supplied with corresponding block addresses each having a low level.

In a case where the received block address BLK_ADDR00 is at a high level, the block address comparator 121 may output a comparison signal OUT00 of a high level when a first using check bit UCB00 of a using check bit circuit 14 or a first refresh check bit RCB00 of a refresh check bit circuit 15 is at a high level. But, the block address comparator 121 may output a comparison signal OUT00 of a low level when the first using check bit UCB00 and the first refresh check bit RCB00 are all at a low level.

In a case where the received block address BLK_ADDR00 is at a low level, the block address comparator 121 may output a comparison signal OUT00 of a low level regardless of a first using check bit UCB00 and a first refresh check bit RCB00. If a first block is selected, block addresses BLK_ADDR01 to BLK_ADDRXY of unselected blocks are set to a low level. Accordingly, block address comparators 121 corresponding to the block addresses BLK_ADDR01 to BLK_ADDRXY output comparison output signals OUT01 to OUTXY each having a low level. The comparison output signal OUT00 of a high level is supplied to an OR gate OR21 of the refresh command signal transfer part 1221.

The OR gate OR21 receives the comparison output signals OUT00 to OUTXY. Since the comparison output signal OUT00 is at a high level, the OR gate OR21 outputs a signal Pre_E of a high level. The signal Pre_E of a high level is supplied to a first input terminal of an AND gate AND21. During a refresh operation, the partial refresh start signal PRS is activated high. Accordingly, the AND gate AND21 outputs a refresh transfer control signal E of a high level in response to a high-level signal Pre_E and the partial refresh start signal PRS of a high level. The buffer BUF21 is turned on in response to the refresh transfer control signal E of a high level. This means that the refresh command REF_CMD is transferred to a memory cell array 19 via the buffer BUF21. Accordingly, a first block of the memory cell array 19 may perform a refresh operation in response to the refresh command REF_CMD.

On the other hand, the block address comparator 121 outputs a comparison output signal OUT00 of a low level if both the first using check bit UCB00 and the first refresh check bit RCB00 are not checked. This means that the OR gate OR21 is supplied with signals OUT00 to OUTXY each having a low level. Accordingly, a signal Pre_E of a low level is output from the OR gate OR21. Although the partial refresh start signal PRS is activated high during a refresh operation, the AND gate AND21 outputs the refresh transfer control signal E of a low level. As a result, since the buffer BUF21 is turned off by the refresh transfer control signal E, the refresh command REF_CMD is not transferred to the memory cell array 19. That is, a refresh operation is not performed with respect to a first block.

In a case where different blocks from the first block are selected, the block address comparators 121 operate the same as described above. Accordingly, when any block is selected according to decoded block addresses BLK_ADDR00 to BLK_ADDRXY, the partial refresh control circuit 12 makes the selected block be refreshed when a using check bit of a using check bit circuit 14 or a refresh check bit of a refresh check bit circuit 15 corresponding to the selected block is checked.

At a refresh operation, each block of a memory cell array 19 may be selected sequentially, and a refresh operation to a selected block may be determined according to whether a corresponding using check bit of a using check bit circuit 14 or a corresponding refresh check bit circuit 15 is checked. Assuming that using check bits in the using check bit circuit 14 or refresh check bits in the refresh check bit circuit 15 are checked as shown in FIG. 6, a refresh operation is performed with respect to blocks 0, 1, 2, 3, 7, 12, 14 and 15 are refreshed while it is not performed with respect to remaining blocks.

As a result, the partial refresh control circuit 12 may control a refresh operation with respect to a block corresponding to a checked refresh or using check bit. Accordingly, since a dynamic random access memory 100 performs a refresh operation only with respect to blocks necessitating a refresh operation, it is possible to reduce power consumption.

As other embodiments, a memory 100 according to the present invention may be configured such that the signals PRS, CHS, CHK_RST, and RST are generated within the memory 100 based on commands from the memory controller 20.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A memory device comprising:
a memory cell array having a plurality of memory blocks;
a memory controller for controlling a refresh operation with respect to the memory blocks;
a refresh check bit circuit for storing refresh check bits corresponding to the memory blocks, respectively;
a block select control circuit for setting refresh check bits of memory blocks to be refreshed to a checked state according to a first control signal of the memory controller;
a using check bit circuit for storing using check bits corresponding to the memory blocks, respectively, wherein the using check bits indicate blocks to which access is requested in the memory cell array;
a using check control circuit for setting using check bits of memory blocks to which access is requested to a checked state according to a second control signal of the memory controller; and
a partial refresh control circuit for controlling the refresh operation such that memory blocks corresponding to checked using check bits or checked refresh check bits are refreshed according to a third control signal of the memory controller.

2. The memory device of claim 1, wherein the memory device may be used as an internal memory of a system on chip.

3. The memory device of claim 1, wherein the using check control circuit comprises using check circuits corresponding to the using check bits, respectively, wherein the using check circuits are configured to reset corresponding using check bits according to the second control signal of the memory controller.

4. The memory device of claim 3, wherein each of the using check circuits comprises:
a first check signal generator for generating a first check signal in response to an access signal, a block address, and a checking start signal as the second control signal from the memory controller;
a second check signal generator for generating a second check signal in response to the block address, the checking start signal, and a checking reset signal from the memory controller; and
a third check signal generator for setting a corresponding using check bit to the checked state in response to the first and second check signals,
wherein the access signal is activated when a selected memory block is access requested, wherein the first check signal generator activates the first check signal when the block address is an address of the selected memory block and the access and check start signals are activated, wherein the second check signal generator inactivates the second check signal when the checking start signal is activated.

5. The memory device of claim 4, wherein the third check signal generator is configured to set the corresponding using check bit to the checked state in response to the activated first check signal and the inactivated second check signal.

6. The memory device of claim 4, wherein the checking reset signal is selectively activated after the checking start signal is inactivated, wherein the second check signal generator activates the second check signal in response to the inactivated checking reset signal.

7. The memory device of claim 6, wherein the third check signal generator resets the using check signal corresponding to the selected memory block in response to the activated second check signal.

8. The memory device of claim 4, wherein the third check signal generator is configured to reset the corresponding using check bit in response to a reset signal as a fourth control signal from the memory controller.

9. The memory device of claim 1, wherein the partial refresh control circuit comprises:
a plurality of block address comparators, each comparing a corresponding block address, a corresponding using check bit and a corresponding refresh check bit; and
a refresh command signal transferor for selectively outputting a refresh command signal from the memory controller in response to comparison results and a partial refresh start signal from the memory controller.

10. The memory device of claim 9, wherein each of the block address comparators outputs an activated comparison output signal when the corresponding block address is an address of a selected memory block and the corresponding using check bit or refresh check bit is set to a checked state.

11. The memory device of claim 10, wherein the refresh command signal transferor sends the refresh command signal to the selected memory block in response to the activated partial refresh start signal and at least one activated comparison output signal of the comparison output signals.

12. The memory device of claim 9, wherein each of the block address comparators outputs an inactivated comparison output signal when the corresponding block address is an address of a selected memory block and corresponding using check bit and refresh check bit are set to a checked state.

13. The memory device of claim 12, wherein the refresh command signal transferor prevents the refresh command signal from being transferred to the selected memory block in response to the activated partial refresh start signal and the inactivated comparison output signal.

14. A refresh method of a memory device comprising:
    storing refresh check bits corresponding to memory blocks;
    setting refresh check bits corresponding to memory blocks to be refreshed to a checked state in response to a first control signal of a memory controller;
    storing using check bits corresponding to the memory blocks, respectively, wherein the using check bits indicate blocks to which access is requested;
    setting using check bits corresponding to memory blocks to be accessed to a checked state in response to a second control signal of the memory controller; and
    controlling a refresh operation such that memory blocks corresponding to checked using check bits or checked refresh check bits are refreshed in response to a third control signal of the memory controller.

15. The refresh method of claim 14, wherein setting using checks bits comprises:
    generating a first check signal in response to an access signal, a block address, and a checking start signal as the second control signal from the memory controller;
    generating a second check signal in response to the block address, the checking start signal, and a checking reset signal from the memory controller; and
    setting a corresponding using check bit to the checked state in response to the first and second check signals,
    wherein the access signal is activated when a selected memory block is access requested, wherein the first check signal is activated when the block address is an address of a selected memory block and the access and check start signals are activated, wherein the second check signal is inactivated when the checking start signal is activated.

16. The refresh method of claim 15, wherein a using check bit is set to a checked state according to the activated first check signal and the inactivated second check signal.

17. The refresh method of claim 15, wherein the checking reset signal is selectively activated after the checking start signal is inactivated, further comprising activating the second check signal in response to the inactivated checking reset signal.

18. The refresh method of claim 17, further comprising resetting a using check signal corresponding to a selected memory block in response to the activated second check signal.

19. The refresh method of claim 15, further comprising resetting a using check bit in response to a reset signal as a fourth control signal from the memory controller.

20. The refresh method of claim 14 wherein controlling corresponding memory blocks comprises:
    comparing a block address, a using check bit and a refresh check bit; and
    selectively outputting a refresh command signal from the memory controller in response to a comparison result and a partial refresh start signal from the memory controller.

21. The refresh method of claim 20, wherein an activated comparison output signal is output when the block address is an address of a selected memory block and the using check bit or refresh check bit is set to a checked state.

22. The refresh method of claim 21, wherein the refresh command signal is sent to the selected memory block in response to the activated partial refresh start signal and the activated comparison output signal.

23. The refresh method of claim 20, wherein an inactivated comparison output signal is output when the block address is an address of a selected memory block and the using check bit and refresh check bit are set to a checked state.

24. The refresh method of claim 23, wherein the refresh command signal is prevented from being transferred to the selected memory block in response to the activated partial refresh start signal and the inactivated comparison output signal.

* * * * *